(12) United States Patent
Selander

(10) Patent No.: US 6,356,114 B1
(45) Date of Patent: Mar. 12, 2002

(54) HIGH SPEED RECEIVER WITH INTEGRATED CMOS AND PECL CAPABILITY

(75) Inventor: Karl Selander, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/761,049

(22) Filed: Jan. 16, 2001

(51) Int. Cl.⁷ .............................................. H03K 19/094
(52) U.S. Cl. .............................. 326/83; 326/66; 326/86; 326/63
(58) Field of Search .............................. 326/63, 66, 68, 326/69, 73, 86

(56) References Cited

U.S. PATENT DOCUMENTS

| | | |
|---|---|---|
| 5,495,184 A | 2/1996 | Des Rosiers et al. .......... 326/73 |
| 5,506,528 A | 4/1996 | Cao et al. .................... 327/108 |
| 5,539,333 A | 7/1996 | Cao et al. ...................... 326/63 |
| 5,539,338 A * | 7/1996 | Moreland ..................... 327/19 |
| 5,576,644 A | 11/1996 | Pelella ........................ 327/51 |
| 5,614,843 A | 3/1997 | Mita et al. .................... 326/73 |
| 5,633,602 A * | 5/1997 | Sanwo et al. ................. 326/73 |
| 5,874,837 A | 2/1999 | Manohar et al. .............. 326/83 |
| 5,963,053 A | 10/1999 | Manohar et al. .............. 326/60 |
| 6,049,229 A | 4/2000 | Manohar et al. .............. 326/83 |
| 6,281,714 B1 * | 8/2001 | Ang et al. ..................... 327/56 |

* cited by examiner

*Primary Examiner*—Michael Toker
*Assistant Examiner*—Vibol Tan
(74) *Attorney, Agent, or Firm*—H. Daniel Schnurmann; Cantor Colburn LLP

(57) ABSTRACT

An apparatus for receiving an input clock signal to an integrated circuit device is disclosed. In an exemplary embodiment of the invention, the apparatus includes a CMOS receiver configured to receive the input clock signal and a PECL receiver configured to receive the input clock signal. The PECL receiver shares a common output node with the CMOS receiver. A receiver selection mechanism is coupled to the CMOS receiver and the PECL receiver, with the receiver selection mechanism alternatively activating or deactivating the CMOS receiver and the PECL receiver.

20 Claims, 2 Drawing Sheets

HIGH SPEED RECEIVER WITH INTEGRATED CMOS AND PECL CAPABILITY

BACKGROUND OF THE INVENTION

The present invention relates generally to data processing systems and, more particularly, to a receiver circuit having a clock signal input.

Many application-specific integrated circuits (ASICs) presently in use have an external clock signal as an input thereto. A clock signal is a steady stream of timing pulses (e.g., from a crystal oscillator) that synchronize the operations within a data processing system or integrated circuit. For example, the clock rate of a computer essentially determines the maximum operating speed of the computer.

Several embodiments of clock signal output circuitry are in existence. Two such examples are differential Positive Emitter Coupled Logic (PECL) oscillators and Complimentary Metal-Oxide Semiconductor (CMOS) field-effect transistor logic circuitry. Generally speaking, PECL is part of a highly specialized logic family normally used in high speed data transition and transmission applications. PECL oscillators, having differential outputs, generally provide tighter output tolerances but tend to be more expensive than CMOS technology. CMOS logic, on the other hand, is typically less expensive than PECL, and is used in low power applications. Thus, certain circuit designs which are cost sensitive are more amenable to CMOS logic, while other designs which are performance sensitive may be more amenable to PECL.

Another important difference between PECL and CMOS technology is the applicable logic levels used by each. Typically, a CMOS logic circuit has a rail (high state) voltage of approximately 3.3 volts. On the other hand, a PECL logic circuit typically operates with a differential voltage swing which is less than that of a CMOS circuit, approximately 1 volt. It can be seen, therefore, that the difference between the two logic families may present difficulties with regard to the interchangeability of external components, such as oscillators, used in conjunction with a particular design of integrated circuit.

BRIEF SUMMARY OF THE INVENTION

The above discussed and other drawbacks and deficiencies of the prior art are overcome or alleviated by an apparatus for receiving an input signal to an integrated circuit device. In an exemplary embodiment of the invention, the apparatus includes a CMOS receiver configured to receive the input signal and a PECL receiver configured to receive the input signal. The PECL receiver shares a common output node with the CMOS receiver. A receiver selection mechanism is coupled to the CMOS receiver and the PECL receiver, with the receiver selection mechanism alternatively activating or deactivating the CMOS receiver and the PECL receiver.

In a preferred embodiment, a first input terminal and a second input terminal, are configured to receive the input clock signal. A biasing network is connected to said first and said second input terminals which, when activated, provides a bias voltage on the first and second input terminals. The biasing network is activated whenever the PECL receiver is activated. The CMOS receiver is activated by the receiver selection mechanism when the second input terminal is connected to ground, while the PECL receiver is deactivated by the receiver selection mechanism when the second input terminal is connected to ground.

BRIEF DESCRIPTION OF THE DRAWINGS

Referring to the exemplary drawings wherein like elements are numbered alike in the several Figures.

DETAILED DESCRIPTION OF THE PREFERRED EMBODIMENT

Figure 1:
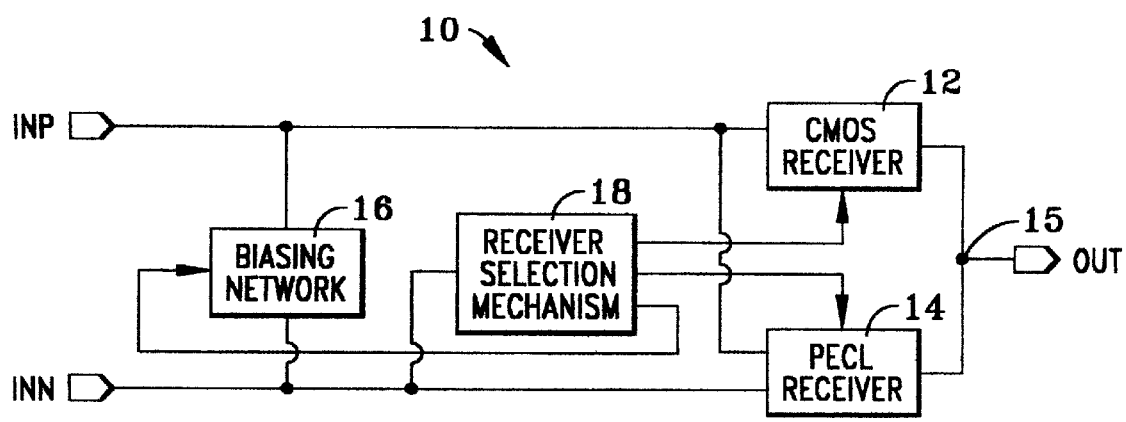
FIG. 1 is a functional block diagram of an apparatus for receiving an input signal to an integrated circuit device.

Referring initially to FIG. 1, an apparatus for receiving an input clock signal to an integrated circuit device, according to an embodiment of the invention, is shown. Apparatus 10 includes both a CMOS receiver 12 and a PECL receiver 14. A pair of inputs, INP and INN, are the positive and negative inputs, respectively, to PECL receiver 14. Only the positive input, INP, is connected to CMOS receiver 12. When the CMOS receiver 12 is activated (as described in greater detail hereinafter) the negative input INN is connected to ground. However, when the PECL receiver 14 is activated (also described in greater detail hereinafter), both INP and INN are used as differential inputs. Both the CMOS receiver 12 and the PECL receiver 14 are connected to a common output node 15, also designated by "OUT".

A biasing network 16 is coupled to both the positive input INP and negative input INN to establish the direct current (dc) bias point of the differential inputs (at INP and INN) when the PECL receiver 14 is activated. Finally, a receiver selection mechanism 18 is coupled to both the CMOS receiver 12 and the PECL receiver 14. Receiver selection mechanism 18 selectively activates either the CMOS receiver 12 or the PECL receiver 14, while simultaneously deactivating the receiver not in use. Receiver selection mechanism 18 is also connected to biasing network 16, deactivating the same, when the PECL receiver 14 is deactivated and the CMOS receiver is activated 12.

Figure 2:
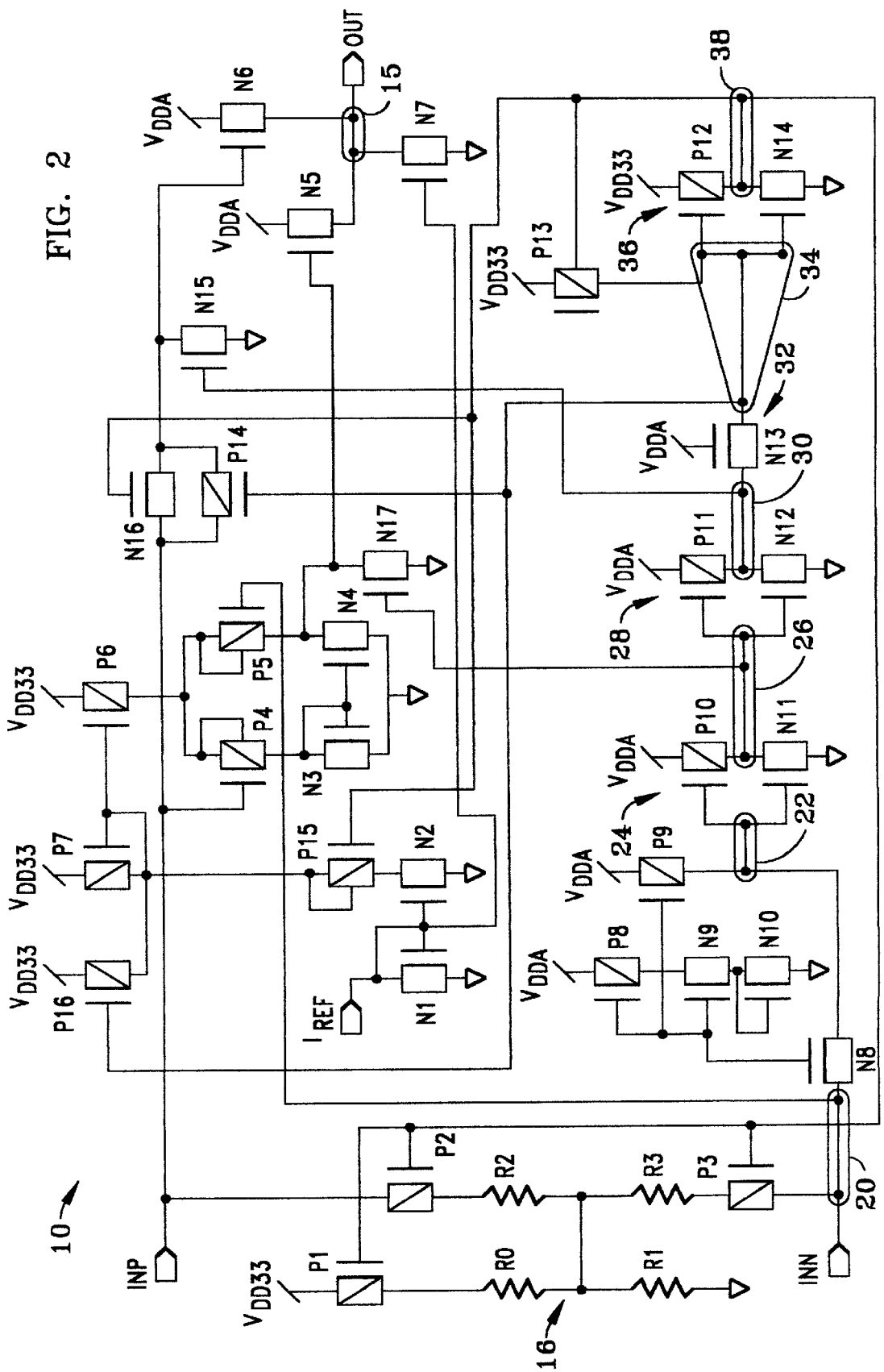
FIG. 2 is a circuit schematic of one possible embodiment of the apparatus in FIG. 1.

Referring now to FIG. 2, a circuit embodiment of apparatus 10 is shown. The biasing network 16, used when the PECL receiver 14 is activated, includes resistors R0, R1, R2 and R3. A trio of p-type field effect transistors (PFETs), designated by P1, P2 and P3, provides the shut-off capability for biasing network 16 when the PECL receiver 14 is deactivated and the CMOS receiver 12 is activated. The CMOS receiver 12 includes two n-type field effect transistors (NFETs), designated by N6 and N7, while the PECL receiver 14 includes a series of NFETs and PFETs. Specifically, the PECL receiver 14 includes NFETs designated by N2, N3, N4, N5 and N7, as well as PFETs designated by P4, P5, P6 and P7. In addition, the receiver selection mechanism 18 circuitry includes NFETs designated by N8 through N17 and PFETs designated P8 through P16. Finally, NFET N1 is used to receive bias current from a reference source, $I_{REF}$, which bias current is mirrored to both the CMOS receiver 12 circuitry and the PECL receiver 14 circuitry.

As will be described in greater detail hereinafter, apparatus 10 also includes two separate supply voltages, designated by $V_{DD33}$ and $V_{DDA}$, which provide power to the FETs. In a preferred embodiment, $V_{DD33}$ is approximately 3.3 volts and $V_{DDA}$ is approximately 1.8 volts. However, those skilled in the art will easily appreciate that other values of supply voltages may be used.

The functional operation of apparatus 10 will be understood by beginning with a description of the activation of the PECL receiver 14. In this mode of operation, both inputs INN and INP are ac (capacitively) coupled so that biasing network 16 may establish a proper dc bias voltage at the inputs (INN and INP) of PECL receiver 14. To this end, PFET P9 provides a small trickle current which flows through NFET N8 and to the negative input INN. Any capacitance on node 20 is then charged up, thereby pulling up the voltage at INN. The magnitude of the trickle current flowing through P9 and N8 is established by PFET P8, and NFETs N9 and N10. These components set a biasing voltage for P9 and N8, generating an appropriate trickle current therethrough, depending upon the voltage drop (if any) seen at INN.

If the voltage at INN falls below an established value, the trickle current will flow through P9 and N8, thereby pulling up the voltage at node 22 to $V_{DDA}$, or 1.8 volts. Node 22 is also connected to the input of a first inverter 24, which comprises PFET P10 and NFET N11. One skilled in the art will recognize that the output of first inverter 24, connected to node 26, is driven to ground. As a result, NFET N17 is turned off as the gate thereof is also connected to node 26. Once N17 is turned off, the output stage of the PECL receiver is enabled. Furthermore, node 26 is also connected to the input of a second inverter 28, which comprises PFET P11 and NFET N12. As such, the output of second inverter 28, at node 30, is driven high (1.8 volts). When node 30 is high, NFET N15 is turned on while PFETs P14 and P16 are turned off, thereby disabling the circuitry in CMOS receiver 12 and enabling the circuitry in PECL receiver 14.

A pass gate 32, comprising NFET N13, is used to provide translation between 3.3 volt source $V_{DD33}$ and 1.8 volt source $V_{DDA}$, as well as to provide isolation therebetween. Since the inputs INP and INN are capable of receiving a 3.3 volt CMOS signal, corresponding circuit components having 3.3 volt tolerances are used. Accordingly, a means of isolation between the power sources and the components is provided. Pass gate 32, when node 30 is high, passes a 1.8 volt signal from the source terminal of N13 to the drain terminal thereof, less a slight threshold value. Another node 34, connected to the drain of N14, is also connected to the input of a third inverter 36 that comprises PFET P12 and NFET N14. However, unlike first inverter 24 and second inverter 26, PFET P12 of third inverter 36 is supplied from 3.3 volt source $V_{DD33}$. Once the 1.8 volt signal is passed from pass gate 32 to the input of the third inverter 36 at node 34, the output of the third inverter 36 is driven low at node 38.

Because node 38 is also connected to the gate of PFET P13, P13 is thus switched on, thereby pulling up the gates of the third inverter 36 (at node 34) to the full CMOS rail voltage of 3.3 volts. This, in turn, causes N13 to be turned off since both the source and drain terminals thereof are raised to 3.3 volts while the gate voltage is held at 1.8 volts. Once turned off, N13 prevents the reverse flow of current from the 3.3 volt supply $V_{DD33}$ to the 1.8 volt components.

The shutdown of the CMOS receiver 12 circuitry is completed as the low output of third inverter 36 (as seen at node 38) is also connected to NFET N16, shutting it off. Node 38 is also connected to the gates of PFETs P1, P2 and P3, turning those devices on and thus connecting biasing network 16 to inputs INN and INP. Finally, the enablement of the PECL receiver 14 is completed when PFET P15 (having its gate also connected to node 38) is switched on, allowing the bias current for the differential stage to flow. When biasing network 16 is enabled, inputs INN and INP are pulled up to an operational dc bias level. It should be noted that for proper operation of PECL receiver 14, the input voltage at INN is pulled up above the voltage at the gate of N8 by such a magnitude which is greater than the amplitude of the input signal less the threshold voltage of N8. This will ensure that N8 is shut off, thereby preventing the circuitry or receiver selection mechanism 18 from affecting the operation of PECL receiver 14. The proper biasing voltage at inputs INN and INP may be attained by carefully sizing FETs P8, N9 and N10.

As stated earlier, in order to activate the CMOS receiver 12 and deactivate the PECL receiver, the input at INN is connected to ground. Upon connecting INN to ground, the sequence of events as described above is essentially reversed. Specifically, the input of the first inverter 24 at node 22 is pulled to ground, as N8 is a pass gate biased by P8, N9 and N10. P9, being a "weak" device, has its drain terminal (also connected to node 22) pulled to ground. Thus, the output of the first inverter 24 is switched high. As a result, a high output appears at node 34 and a low output appears at node 38, causing N16 and P14 to be turned on. Further, N15 is also switched off and the CMOS receiver 12 is fully enabled. In addition, it can also be seen that the PECL receiver 14 circuitry is simultaneously disabled. PFETs P1, P2 and P3 are turned off, thus disconnecting biasing network 16 from inputs INN and INP. Lastly, P15 is switched off while P16 and P17 are switched on, completing the deactivation of the PECL receiver 14 circuitry. Thus configured, apparatus 10 is capable of receiving a 3.3 volt, single ended CMOS input signal and translating it to a 1.8 volt output while consuming little power.

From the foregoing description, it is seen that apparatus 10 provides an integrated CMOS/PECL receiver that is capable of operating with either a pair of differential, capacitively coupled inputs or a single ended input. Apparatus 10 further provides a voltage signal level translation from 3.3 volts to 1.8 volts, which may then be used internally by an integrated circuit. Furthermore, the apparatus 10 conserves power as the receiver selection mechanism 18 automatically shuts down those circuit components in the receiver not being used. A further benefit is the fact that the particular receiver in operation may be easily identified by simply checking whether INN is grounded or not. If INN is grounded, the CMOS receiver 12 is activated; if not, the PECL receiver 14 is activated.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for receiving an input signal to an integrated circuit device, the apparatus comprising:
   a CMOS receiver configured to receive the input signal;
   a PECL receiver configured to receive the input signal, said PECL receiver sharing a common output node with said CMOS receiver; and
   a receiver selection mechanism coupled to said CMOS receiver and said PECL receiver, said receiver selection mechanism alternatively activating or deactivating said CMOS receiver and said PECL receiver.

2. The apparatus of claim 1, further comprising:
a first input terminal and a second input terminal, said first and second input terminals configured to receive the input signal.

3. The apparatus of claim 2, further comprising:
a biasing network connected to said first and said second input terminals;
said biasing network, when activated, providing a bias voltage on said first and said second input terminals.

4. The apparatus of claim 3, wherein said biasing network is activated when said PECL receiver is activated.

5. The apparatus of claim 2, wherein said CMOS receiver is activated by said receiver selection mechanism when said second input terminal is connected to ground.

6. The apparatus of claim 2, wherein said PECL receiver is deactivated by said receiver selection mechanism when said second input terminal is connected to ground.

7. The apparatus of claim 2, wherein:
said CMOS receiver is activated whenever said PECL receiver is deactivated; and
said PECL receiver is activated whenever said CMOS receiver is deactivated.

8. The apparatus of claim 1, wherein said input signal is a clock signal.

9. The apparatus of claim 1, wherein said receiver selection mechanism comprises an inverter.

10. The apparatus of claim 1, wherein said receiver selection mechanism comprises:
a first inverter powered by a first voltage source;
a second inverter powered by said first voltage source;
a third inverter powered by a second voltage source; and
a pass gate, coupled between said second and third inverters, said pass gate providing power isolation between said first voltage source and said second voltage source.

11. The apparatus of claim 10, wherein said first, second and third inverters each comprise an n-type field effect transistor and a p-type field effect transistor.

12. The apparatus of claim 3, wherein said biasing network further comprises a series of resistors, said resistors operably coupled to the input signal by a series of p-type field effect transistors.

13. A method for receiving an input signal to an integrated circuit device, the method comprising:
configuring a CMOS receiver to receive the input signal;
configuring a PECL receiver to receive the input signal;
connecting a common output node to said CMOS receiver and said PECL receiver;
selectively activating and deactivating said CMOS receiver and said PECL receiver, depending upon the characteristics of the input signal.

14. The method of claim 13, further comprising:
configuring a first input terminal and a second input terminal to receive the input signal.

15. The method of claim 14, further comprising:
configuring a biasing network to said first and said second input terminals;
said biasing network, when activated, providing a bias voltage on said first and said second input terminals.

16. The method of claim 15, further comprising activating said biasing network when said PECL receiver is activated.

17. The method of claim 14, further comprising activating said CMOS receiver by connecting said second input terminal to ground.

18. The method of claim 14, further comprising deactivating said PECL receiver by connecting said second input terminal to ground.

19. The method of claim 2, further comprising:
activating said CMOS receiver whenever said PECL receiver is deactivated; and
activating said PECL receiver whenever said CMOS receiver is deactivated.

20. The method of claim 13, wherein said input signal is a clock signal.

* * * * *